United States Patent [19]
Gurovich et al.

[11] Patent Number: 6,004,726
[45] Date of Patent: Dec. 21, 1999

[54] METHOD OF FORMING A LITHOGRAPHIC PATTERN UTILIZING CHARGED BEAM PARTICLES BETWEEN 0.1 AND 5.0 EV

[76] Inventors: Boris Aronovich Gurovich, Leningradskoe shosse, d. 94, kor. 1, kv. 32, 125565, Moscow; Dmitry Iosifivich Dolgy, Nemansky proezd, d.1, kor. 1, kv. 154, 123181, Moscow; Evgeny Pavlovich Velikhov, Pekhotnaya ul., d. 24, 123182, Moscow; Evgenia Anatolievna Kuleshova, Sumskoi proezd, d.4, kor.1, kv.5, 113208 Moscow; Boris Aronovich Aronzon, Strykovskaya ul., d. 10, kv. 96, 109316, Moscow; Evgeny Zalmanovich Meilikhov, Marshsla Vasilevskogo ul., d.1, kor.2, kv. 40, 123182, Moscow; Evgeny Petrovich Ryazantsev, Marshala Vasilevskogo ul., d.15, kor.1, kv.32, 123182, Moscow; Vladimir Vasilievich Rylkov, 16-aya Parkovaya ul., d.55, kor.2, kv. 146, 105523, Moscow; Kirill Evgenievich Prikhodko, Vasiliya Petushkova ul., d. 21, kor. 2, kv. 146, 123373, Moscow; Alexandr Grigorievich Domantovsky, Snezhnaya ul., d.15, kor. 2, kv. 39, 129323, Moscow; Yaroslav Igorevich Shtrombakh, Mnevniki ul., d.7, kor.6, kv. 37, 123308, Moscow; Evgeny Dmitrievich Olshansky, Zoologicheskaya ul., d.12, kv.122, 123242,Moscow, all of Russian Federation

[21] Appl. No.: 09/316,533

[22] Filed: May 21, 1999

[30] Foreign Application Priority Data

May 22, 1998 [RU] Russian Federation ............. 98109497

[51] Int. Cl.$^6$ ...................................................... G03C 5/00
[52] U.S. Cl. ................................................................ 430/296
[58] Field of Search ............................................... 430/296

[56] References Cited

U.S. PATENT DOCUMENTS

| | | | |
|---|---|---|---|
| 5,279,925 | 1/1994 | Berger et al. | 430/246 |
| 5,376,505 | 12/1994 | Berger et al. | 430/296 |
| 5,468,595 | 11/1995 | Livesay | 430/296 |
| 5,561,008 | 10/1996 | Berger et al. | 430/4 |
| 5,789,140 | 8/1998 | Chou et al. | 430/296 |

*Primary Examiner*—Christopher G. Young
*Attorney, Agent, or Firm*—Collard & Roe, P.C.

[57] ABSTRACT

A method of forming a lithographic pattern consists in establishing a charged beam, isolating such charged particles that have the energy dispersion falling within 0.1 and 5.0 eV, and removing such particles from the beam that have the energy dispersion lying outside said range. Then the thus-established charged beam is subjected to primary focusing until the beam divergence value of from $5.10^{-2}$ to $10^{-4}$ rad is attained, a mask having a pattern stencil is irradiated with the focused charged beam. Thereupon the charged beam that has been modulated while passing through the mask is subjected to secondary focusing in order to form on the radiation-sensitive layer under processing a lithographic pattern corresponding to the stencil of a scaled-down mask pattern.

1 Claim, 1 Drawing Sheet

METHOD OF FORMING A LITHOGRAPHIC PATTERN UTILIZING CHARGED BEAM PARTICLES BETWEEN 0.1 AND 5.0 EV

FIELD OF THE INVENTION

The present invention can find application in the field of microelectronics for lithographic formation of integrated circuits, memories, and optic elements having some elements of the conductive structure falling within the nanometric range.

BACKGROUND OF THE INVENTION

Up till now the modern microelectronics has been developing by way of successively reducing the microcircuit elements from micron to submicron size range. But ever increasing urgent demands in developing nanometric-size elements leads to search for novel techniques of lithographic formation of a conducting structure that assure high resolution which herein implies a minimum size of the elements of the conducting structure under development, that determines a limiting permissible density of a conducting structure elements per unit length or unit area without a contact therebetween.

One prior-art method of forming a pattern by lithographic imaging (cf. U.S. Pat. No. 5,376,505). The method consists in that a substrate carrying a radiation-sensitive material is irradiated, through a mask, with a beam of charged particles, with the result that said material is transformed to form on the substrate a pattern corresponding to the mask pattern stencil. The charged particles are accelerated to a velocity corresponding to de Broglie wavelength and having its maximum value below the preset projection accuracy. The beam is established by particles which move within a certain solid angle along different paths, whereby said particles get incident upon the substrate surface at different angles, too. To attain a preset accuracy of forming a lithographic pattern, resort is made to scanning some mask areas so that the beam changes its position in passing from transparent areas (i.e., mask pattern stencil) to shaded ones, and vice versa.

The beam particles differ widely from one another as to the mean charge value thereof, otherwise speaking, there occurs dispersion as to energy of charged particles. Insofar as such particles are incident on the mask at different angles, the image of the transparent mask areas (i.e., mask pattern stencil) on the substrate becomes blurred. These phenomena prevent high resolution to be attained, that is, make it impossible to obtain separate pattern elements having linear dimensions on the order of unities of nanometers. Moreover, mask scanning provided in the known method sophisticates the process and affects adversely its production output.

Another method of forming a lithographic pattern on a radiation-sensitive surface is known (cf. U.S. Pat. No. 5,561, 008) to consists in that a mask with a pattern stencil made therein is once-through exposed to the effect of a beam of charged particles. Once having passed through the mask, said charged beam is focused on a surface (i.e., substrate) carrying a radiation-sensitive material deposited thereon, with the result that said material is transformed to form on the substrate a pattern corresponding to the mask pattern stencil.

It is common knowledge that any source of charged particles is far from being an ideal one because the particles may feature dispersion as to their energy, and the beat itself may have a finite angular divergence. The presence of energy dispersion in charged particles is a source of chromatic aberrations in the image-forming systems and the presence of angular divergence in a charged beam is a source of spherical aberrations. The aforementioned aberration types are, apart from de Broglie wavelength corresponding to the charged particles, a factor which controls a limiting resolution that is attainable in image forming systems.

Thus, high resolution required in microelectronics for fabricating integral circuits and other such products is unattainable unless special restrictions are placed upon the parameters of energy dispersion of a charged beam (chromatic aberrations) and of divergence of a beam incident upon a mask (spherical aberrations).

SUMMARY OF THE INVENTION

It is a primary object of the present invention to provide some elements of a conducting structure having linear dimensions of the order of unities of nanometers.

The foregoing object is accomplished due to the fact that in a method of forming a lithographic pattern comprising the steps of establishing a charged beam, primary focusing of said charged beam, irradiating with the focused charged beam a mask having a pattern stencil, secondary focusing of the charged beam that has been modulated while passing through said mask, in order to form on the radiation-sensitive layer under processing a lithographic pattern corresponding to the stencil of the scaled-down mask pattern, according to the invention, such charged particles are isolated in the beam that have the energy dispersion falling within 0.1 and 5.0 eV, and the beam particles whose energy dispersion lies outside said range are removed from the beam, said primary charged beam focusing being performed until the beam divergence value of from $5.10^{-2}$ to $10^{-4}$ rad is attained.

It is due to the fact that the proposed method makes provision for focusing the charged beam incident on the mask surface to its divergence value falling within $5.10^{-2}$ to $10^{-4}$ rad that spherical aberration occurring in projecting the image of the mask pattern stencil onto the radiation-sensitive layer is much reduced. On the other hand, isolation of the charged particles having energy dispersion in the range from 0.1 to 5.0 eV makes possible, unlike the known methods, to reduce chromatic aberration.

On the whole, it is due to reduced spherical and chromatic aberrations that the proposed method adds to resolution, thereby making practicable obtaining some elements of the conducting structure having linear dimensions on the order of unities of nanometers.

Other objects and advantageous features of the present invention will become obvious from a detailed description of the invention and of the exemplary embodiments thereof.

BRIEF DESCRIPTION OF THE DRAWINGS

The accompanying drawing presents a schematic diagram of the processing unit, wherein the proposed method is carried into effect.

DESCRIPTION OF THE PREFERRED EMBODIMENT

Figure 1:
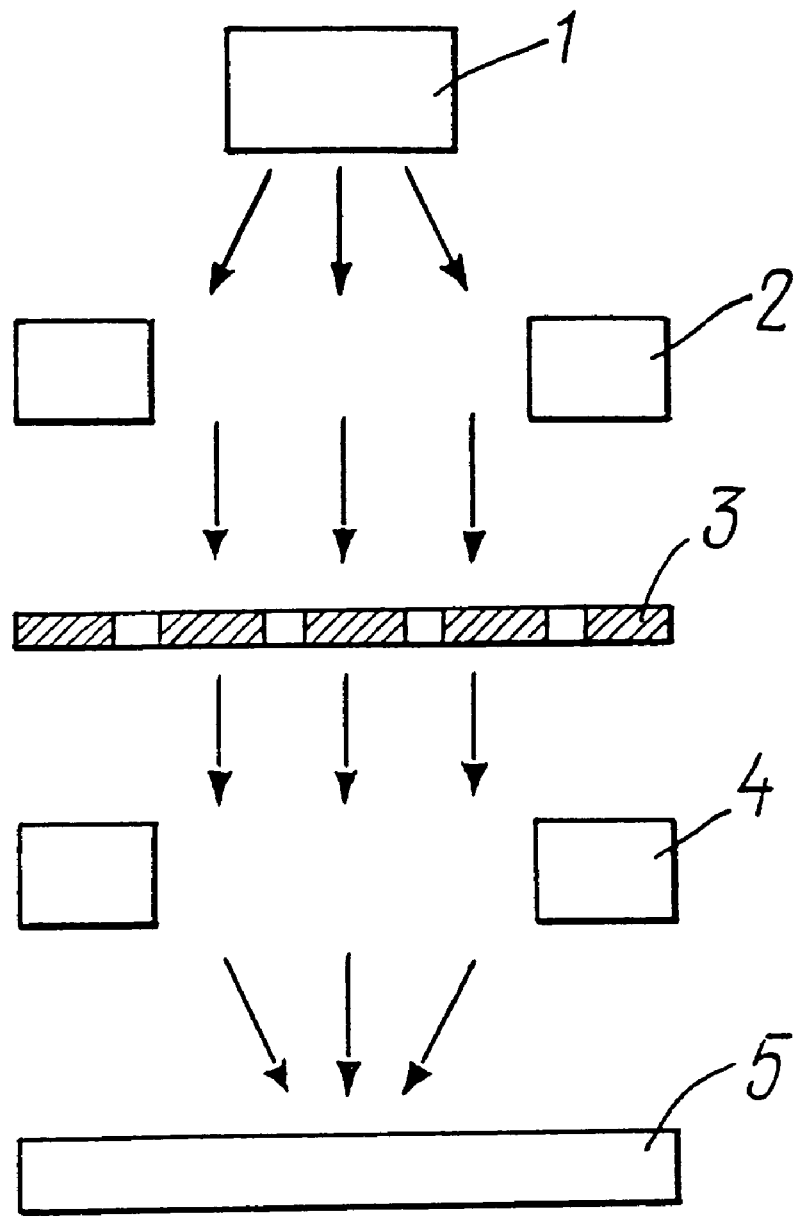

The method of forming a lithographic pattern, according to the invention, consists of the following steps. First a beam of charged particles, i.e., electrons or ions is formed with the use of a source 1 of said charged particles which has a definite energy and a definite energy dispersion falling within 0.1 and 5.0 eV. Then the beam gets rid of the particles whose energy dispersion lies outside said range.

At present there exist such sources of electrons that are capable of proving said energy dispersion of electrons. Whenever an ion source is used (such as thermionic, gas-discharge, surface-plasma, photodesorption, or other sources), an ion beam is passed through the Wien filter (not shown) which provides for a required particle energy dispersion.

The thus-formed charged beam is focused through a system of lenses 2 and directed onto a mask 3 having a pattern stencil.

The system of the lenses 2, e.g., electromagnetic or electrostatic ones, provides for primary focusing of the preformed charged beam so that the beam divergence lies between $5 \cdot 10^{-2}$ and $10^{-4}$ rad. Beam divergence in said range is attainable in modern electron microscopes having the required aperture size, e.g., in illumination systems of GEM 4000 FX transmission microscopes.

The thus-formed charged beam passes through the mask 3, gets spatially modulated as to intensity, and carries information on the stencil of the pattern of the mask 3. Then the charged beam is subjected to secondary focusing onto a radiation-sensitive layer 5, using a system of lenses 4 (electron or ion ones). Irradiation of some areas of said layer 5 with the charged beam modifies the chemical composition of the surface layer by selectively removing the atoms of a definite kind from the layer 5. Thus, conditions are established in the course of irradiation of the layer 5 for separating the materials of the radiation-sensitive layer 5 into a conducting and a nonconducting component of which the latter is displaced inwards the material and renders virtually no influence on its properties, whereas the conducting component remains in the layer of the material so as to establish a plurality of the conducting structure elements having linear dimensions of the order of unities of nanometers.

Thus, a lithographic pattern is established on the radiation-sensitive layer which corresponds to the scaled-down mask pattern stencil. The radiation-sensitive layer may be in fact the surface of a substrate to which the layer of a material transformable under the effect of radiation is applied. Used as such a material may be oxides, hydrides, or nitrides of metals. It is preferable that used as a metal hydride be lanthanum or ytterbium hydride, as a metal oxide be uranium dioxide, and as a metal nitride be gallium nitride; however, the list of metal compounds mentioned before is not limited and use may be made of some other materials suitable for the purpose.

The aforementioned materials are used in the known methods rather infrequently though it is such materials that are capable of displacing the nonconducting component of the radiation-sensitive layer inwards the substrate material when said layer is divided into a conducting and a nonconducting components in the course of irradiation.

The fact that the charged beam directed onto the mask has a divergence of $5 \cdot 10^{-2}$ to $10^{-4}$ rad reduces considerably spherical aberration occurring when projecting the image of the pattern stencil onto the surface being irradiated. It has been found experimentally that when the charged beam divergence is in excess of $5 \cdot 10^{-2}$ rad, spherical aberration results in distorting and blurring the pattern, thus making it impossible to obtain the elements of a lithographic pattern having linear dimensions equal to a few nanometers. Conversely, when the beam divergence is less than $10^{-4}$ rad, the charged beam density is materially reduced which in turn involves a longer exposure time with but a negligible increase in resolution, this being economically unjustifiable in case of quantity production.

As experimental studies have shown, the fact that the beam is formed from charged particles having an energy dispersion of from 0.1 to 5 eV reduces chromatic aberration when projecting the mask pattern stencil onto the surface being irradiated, thereby adding to resolution. To reduce the energy dispersion of the particles below 0.1 eV is unjustifiable because no further noticeable increase in resolution occurs. On the other hand, if said dispersion exceeds 5 eV, the resultant chromatic aberration makes it impossible to obtain the elements of a lithographic pattern having linear dimensions equal to a few nanometers.

To promote understanding of the essence of the method proposed herein and of its advantageous features, given below are some specific exemplary embodiments thereof.

EXAMPLE 1

A wafer measuring 5×5×0.4 mm coated with a radiation-sensitive layer is placed in the radiation chamber of the processing unit described hereinbefore and is fixed in position in a holder. In the example considered herein said wafer is made of silicon oxide and a a 20 nm thick layer of a radiation-sensitive material is applied to the wafer surface. The radiation-sensitive material is in this case lanthanum hydride. A silicon mask is placed in front of the wafer, said mask appearing as a slab measuring 50×50×0.4 mm having a pattern stencil made therein in the form of rows of round holes having a diameter of 100 nm and of lines, each being 100 nm wide and 3 mm long, the pattern elements being spaced 1000 nm apart from one another. Then a vacuum of $10^{-9}$ torr is established in the radiation chamber, first using a forepump and a turbomolecular pump, then an ion-type pump. Used as a source of charged particles is an electron gun having a tungsten thermionic cathode. Then such operating conditions of the electron gun are set that provide an energy dispersion of electrons from 0.1 to 5.0 eV. To this end, a shutter absorbing the electron beam is placed across the pathway thereof. Once the electron gun has reached the normal operating conditions, the shutter is opened to effect a once-through exposure. An electron beam having a divergence of from $5 \cdot 10^{-2}$ to $10^{-4}$ rad is formed, using a system of electromagnetic lenses. Interaction between the modulated electron beam and lanthanum hydride results in selectively removing hydrogen atoms from the radiation-sensitive layer and forming a lithographic pattern. An average electron energy is 300 keV, an electron beam current being 100 mcA. The results are tabulated in Table 1 below.

EXAMPLE 2

The method is carried out with the same parameters as in Example 1 with the sole exception that used as a source of charged particles is a source of ions which provides for generation of hydrogen ions having energy on the order of 1 keV, and used as a radiation-sensitive material is ytterbium hydride, the layer thickness being 10 nm. An average electron energy is 1000 keV, an electron beam current being 60 mcA. The mask used has the same pattern stencil as in Example 1. The results are displayed in Table 2 below.

TABLE 1

| Energy dispersion of electrons, eV | Beam divergence, rad | Exposure time, s | Dimension of pattern element, nm |
|---|---|---|---|
| 3 | $5 \cdot 10^{-2}$ | 3600 | 15 |
| 2 | $5 \cdot 10^{-2}$ | 3600 | 9 |
| 1 | $5 \cdot 10^{-2}$ | 3600 | 9 |
| 0.5 | $5 \cdot 10^{-2}$ | 3600 | 9 |
| 0.5 | $10^{-4}$ | 7200 | 6 |
| 0.5 | $10^{-4}$ | 72000 | 6 |
| 0.1 | $10^{-4}$ | 72000 | 5 |

TABLE 2

| Energy dispersion of electrons, eV | Beam divergence, rad | Exposure time, s | Dimension of pattern element, nm |
|---|---|---|---|
| 3 | $5 \cdot 10^{-2}$ | 5 | 20 |
| 2 | $5 \cdot 10^{-2}$ | 5 | 15 |
| 1 | $5 \cdot 10^{-2}$ | 5 | 12 |
| 0.5 | $5 \cdot 10^{-2}$ | 5 | 12 |

TABLE 2-continued

| Energy dispersion of electrons, eV | Beam divergence, rad | Exposure time, s | Dimension of pattern element, nm |
|---|---|---|---|
| 0.5 | $10^{-4}$ | 10 | 5 |
| 0.5 | $10^{-4}$ | 100 | 3 |
| 0.1 | $10^{-4}$ | 100 | 3 |

What we claim is:

1. A method of forming a lithographic pattern, comprising:

forming a charged beam;

isolating in said preformed beam such charged particles that have energy dispersion falling in the range of from 0.1 to 5.0 eV;

removing from said beam such charged particles that have energy dispersion lying outside said range;

primary focusing of said preformed charged beam so as to provide its divergence in the range of from $5.10^{-2}$ to $10^{-4}$ rad;

irradiating a mask having a pattern stencil, with said focused beam of said isolated charged particles, with said beam divergence and said energy dispersion of said charged particles;

secondary focusing of said charged beam that has been modulated while passing through said mask so as to form on the radiation-sensitive layer under processing a scaled-down lithographic pattern corresponding to said stencil of said pattern of said mask.

* * * * *

UNITED STATES PATENT AND TRADEMARK OFFICE
CERTIFICATE OF CORRECTION

PATENT NO. : 6,004,726
DATED : December 21, 1999
INVENTOR(S) : Gurovich et al.

Page 1 of 1

It is certified that error appears in the above-identified patent and that said Letters Patent is hereby corrected as shown below:

<u>Title page,</u>
Item [54], The title should read:

-- METHOD OF FORMING A LITHOGRAPHIC PATTERN --

Signed and Sealed this

Twenty-fifth Day of December, 2001

*Attest:*

JAMES E. ROGAN
*Attesting Officer*     *Director of the United States Patent and Trademark Office*